(12) United States Patent
Uyama (10) Patent No.: US 8,448,333 B2
(45) Date of Patent: May 28, 2013

(54) METHOD FOR MANUFACTURING WIRING BOARD AND METHOD FOR MANUFACTURING INKJET PRINTHEAD SUBSTRATE

(75) Inventor: Masaya Uyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 527 days.

(21) Appl. No.: 12/640,139

(22) Filed: Dec. 17, 2009

(65) Prior Publication Data

US 2010/0154211 A1    Jun. 24, 2010

(30) Foreign Application Priority Data

Dec. 19, 2008   (JP) ................... 2008-323979

(51) Int. Cl.
*H01L 21/28* (2006.01)
*H05K 3/10* (2006.01)

(52) U.S. Cl.
USPC ............. 29/852; 29/846; 29/832; 29/890.1; 438/21

(58) Field of Classification Search
USPC . 29/830, 831, 832, 846, 856, 852; 427/592.1, 427/621; 257/253, 263, 265, 266; 174/257, 174/258, 264, 267, 72 R; 438/21
See application file for complete search history.

(56) References Cited

U.S. PATENT DOCUMENTS

| | | | | |
|---|---|---|---|---|
| 6,972,070 B2 * | 12/2005 | Yazaki et al. | .............. | 156/308.2 |
| 7,022,609 B2 | 4/2006 | Yamamoto et al. | | |
| 7,416,963 B2 * | 8/2008 | Umemoto et al. | ............ | 438/461 |
| 8,205,967 B2 * | 6/2012 | Uyama et al. | ................... | 347/64 |
| 2007/0007033 A1 * | 1/2007 | Das et al. | ...................... | 174/257 |

FOREIGN PATENT DOCUMENTS

| | | | |
|---|---|---|---|
| JP | 2003-257891 A | | 9/2003 |
| JP | 2004-095849 A | | 3/2004 |
| JP | 2006-032699 A | | 2/2006 |
| JP | 2007096120 A | * | 4/2007 |
| JP | 2007-096120 | * | 12/2007 |

* cited by examiner

*Primary Examiner* — Peter DungBa Vo
*Assistant Examiner* — Kaying Kue
(74) *Attorney, Agent, or Firm* — Canon USA Inc. IP Division (57) ABSTRACT

A method for manufacturing a wiring board includes a first process of preparing a substrate having a hole passing through a first surface and a second surface opposite the first surface; a second process of closing the opening of the hole in the first surface with a wiring member; a third process of supplying a powder conductive material onto the second surface to fill the hole with the conductive material; a fourth process of removing the conductive material that is not charged into the hole from the top of the second surface; and a fifth process of melting the conductive material that fills the hole by heating the conductive material and thereafter solidifying the conductive material.

4 Claims, 6 Drawing Sheets

METHOD FOR MANUFACTURING WIRING BOARD AND METHOD FOR MANUFACTURING INKJET PRINTHEAD SUBSTRATE

BACKGROUND OF THE INVENTION

1. Field of the Invention

The present invention relates to a method for manufacturing a wiring board and a method for manufacturing an inkjet printhead substrate.

2. Description of the Related Art

A wiring board having through-silicon vias is used for high-density silicon IC (integrated circuit) chip packages and various devices, such as electronic devices and optical devices.

The through-silicon via is an electrode formed by filling a through or non-through small pore (more specifically, a small pore in which an insulating layer is formed on the wall thereof) in a semiconductor substrate or a multilayer semiconductor substrate with a conductive material.

Japanese Patent Laid-Open No. 2006-032699 discloses a method for forming through-silicon vias by forming a seed layer in through via holes in a substrate by vacuum deposition and thereafter filling the through via holes with a conductor by an electrolytic plating method.

Japanese Patent Laid-Open Nos. 2004-095849 and 2003-257891 disclose a method for forming through-silicon vias by filling through via holes with conductive paste made of silver or copper by a stencil printing method or a vacuum differential pressure method and burning it.

However, with the method described in Japanese Patent Laid-Open No. 2006-032699, the use of a vacuum deposition unit increases the cost of the apparatus, resulting in an enormous initial investment for mass production. In forming the conductor in the via holes by the electrolytic plating method, in order to uniformly plate the interior of the via holes with the conductor without voids, the plating speed must be low until a sufficient amount of plating solution can be spattered. This makes it difficult to satisfy practical mass-production tact, resulting in high mass-production cost.

On the other hand, the methods described in Japanese Patent Laid-Open Nos. 2004-095849 and 2003-257891 have the problem of an increase in mass production cost due to an increase in the number of processes. The stencil printing method needs an alignment work of positioning a stencil printing plate on a semiconductor substrate, thus increasing the number of processes. The vacuum differential pressure method also needs masking and alignment works for applying conductive paste on desired positions, thus increasing the number of processes.

SUMMARY OF THE INVENTION

The present invention provides a method for manufacturing a wiring board and a method for manufacturing an inkjet printhead substrate in which the mass production cost is reduced by simplifying the through-silicon via forming process and reducing the number of processes.

A method for manufacturing a wiring board according to a first aspect of the present invention includes a first process of preparing a substrate having a hole passing through a first surface and a second surface opposite the first surface; a second process of closing the opening of the hole in the first surface with a wiring member; a third process of supplying a powder conductive material onto the second surface to fill the hole with the conductive material; a fourth process of removing the conductive material that is not charged into the hole from the top of the second surface; and a fifth process of melting the conductive material that fills the hole by heating the conductive material and thereafter solidifying the conductive material.

A method for manufacturing an inkjet printhead substrate according to a second aspect of the present invention includes a first process of preparing a substrate having a first hole passing through a first surface and a second surface opposite the first surface and a second hole passing through the first surface and the second surface opposite the first surface and serving as an ink supply port for supplying ink to a pressure generating element formed on the first surface and generating pressure used to eject the ink; a second process of closing the opening of the first hole in the first surface with a wiring member; a third process of supplying a powder conductive material onto the second surface to fill the first hole with the conductive material; a fourth process of removing the conductive material that is not charged into the first hole from the top of the second surface; and a fifth process of melting the conductive material that fills the first hole by heating the conductive material and thereafter solidifying the conductive material.

The present invention can provide a method for manufacturing a wiring board and a method for manufacturing an inkjet printhead substrate in which the mass production cost is reduced by simplifying the through-silicon via forming process and reducing the number of processes.

Further features of the present invention will become apparent from the following description of exemplary embodiments with reference to the attached drawings.

DESCRIPTION OF THE EMBODIMENTS

Embodiments of the present invention will be described in detail with reference to the drawings. The embodiments below do not limit the scope of the present invention and are provided to describe the invention sufficiently to those skilled in the art of this technical field.

First Embodiment

Figure 1:
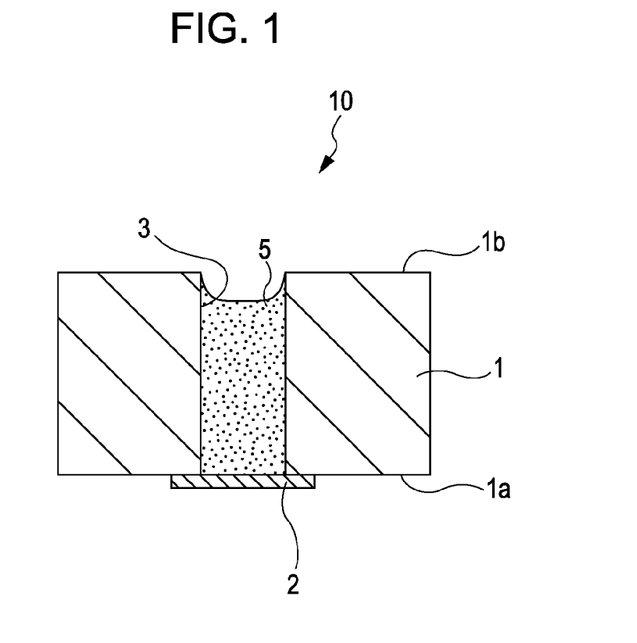
FIG. 1 is a schematic cross-sectional view of a wiring board according to a first embodiment of the present invention.

Referring to FIGS. 1 to 3D, a method for manufacturing a wiring board 10 according to a first embodiment of the present invention, in particular, a method for forming a through-silicon via, described below, on a substrate will be described. FIG. 1 is a schematic cross-sectional view of the wiring board 10 according to the first embodiment; and FIGS. 2A to 2E and FIGS. 3A to 3D are cross-sectional views of the wiring board 10, showing a method for forming a through-silicon via in the wiring board 10.

First, the configuration of the wiring board 10 according to the first embodiment will be described with reference to FIG. 1. The wiring board 10 includes a substrate 1, a wire 2 formed on a first surface 1a of the substrate 1, and a through hole 3 that passes through the first surface 1a of the substrate 1 and a second surface 1b opposite the first surface 1a, in which an opening at the first surface 1a side is closed by the wire 2. A through-silicon via 5 is formed in the through hole 3 so as to fill the through hole 3 and to electrically connect the wire 2 on the first surface 1a to the second surface 1b of the substrate 1.

The substrate 1 is preferably a semiconductor substrate, such as a monocrystal silicon wafer, or a quartz substrate. For the silicon wafer, it is preferable to make the inner wall of the through hole 3 hydrophilic to improve the wettability. The adaptive thickness of the substrate 1 is about 10 to 1000 μm.

The wire 2 may be a conducive layer used in general semiconductor processing and is preferably made of aluminum or the like, depending on the adhesiveness with respect to the conductive through-silicon via 5 formed later. The inner wall of the through hole 3 may be provided with an insulating layer for the electrical insulation between the through-silicon via 5 and the substrate 1, if necessary.

Referring next to FIGS. 2A to 2E, a method for forming the through-silicon via 5 by the method for manufacturing the wiring board 10 of the first embodiment will be described.

Figure 2A:
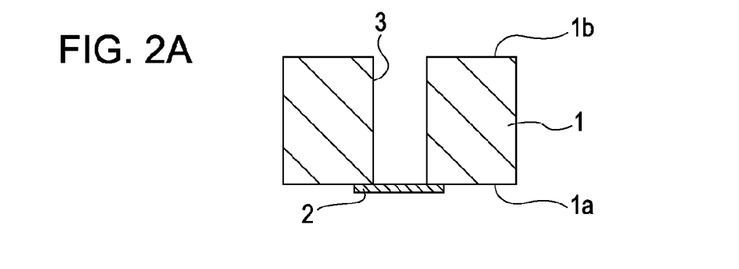
FIG. 2A is a cross-sectional view of the wiring board of the first embodiment, showing a method for forming a through-silicon via.

First, as shown in FIG. 2A, the substrate 1 is set, with first surface 1a having the wire 2 down and the second surface 1b having the through hole 3 up.

Figure 2B:
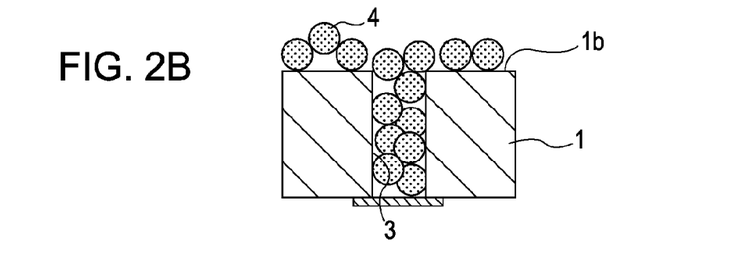
FIG. 2B is a cross-sectional view of the wiring board of the first embodiment, showing the method for forming the through-silicon via.

Next, as shown in FIG. 2B, a sufficient quantity of conductive balls 4 that is a powder conductive material is deposited on the substrate 1 to fill the through hole 3 with the conductive balls 4. The material of the conductive balls 4 is preferably a low-melting alloy represented by solder or low-melting metal. The diameters of the conductive balls 4 need to be uniform and to be smaller than the opening diameter at the second surface 1b side of the through hole 3. However, a relatively large diameter of the conductive balls 4 with respect to the opening diameter of the through hole 3 is not desirable for a process described below because the filling factor of the conductive balls 4 in the through hole 3 is decreased. Therefore, it is desirable that the diameter of the conductive balls 4 be as small as possible. To increase the filling factor of the conductive balls 4, ultrasonic vibrations may be given to the substrate 1.

Figure 2C:
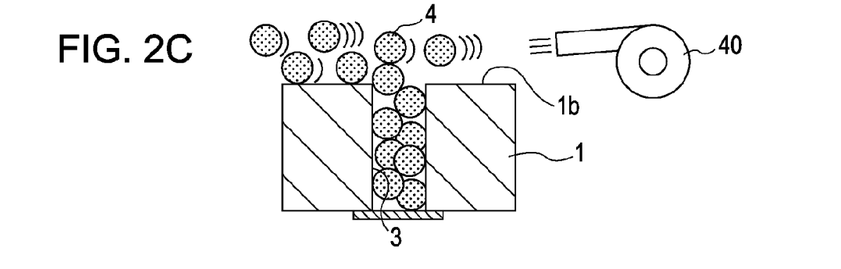
FIG. 2C is a cross-sectional view of the wiring board of the first embodiment, showing the method for forming the through-silicon via.

Next, as shown in FIG. 2C, the excess conductive balls 4 deposited on the second surface 1b of the substrate 1 without being charged into the through hole 3 are removed. As a method for removing the excess conductive balls 4, a method of blowing dry air or nitride gas at an acute angle with respect to the substrate 1 with a blower 40 or the like may be used. Alternatively, a method of shaking off the excess conductive balls 4 by giving ultrasonic vibration, with the substrate 1 inclined, may be used.

Figure 2D:
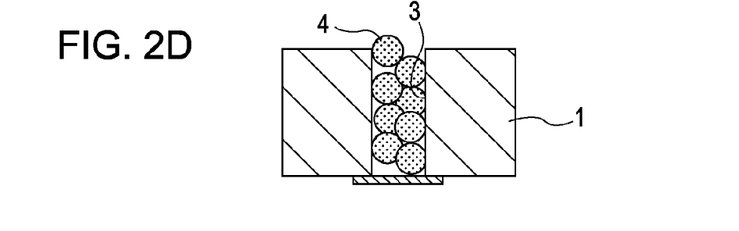
FIG. 2D is a cross-sectional view of the wiring board of the first embodiment, showing the method for forming the through-silicon via.
Figure 2E:
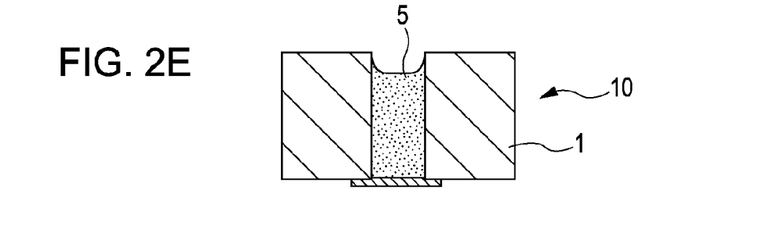
FIG. 2E is a cross-sectional view of the wiring board of the first embodiment, showing the method for forming the through-silicon via.

As shown in FIG. 2D, the excess conductive balls 4 on the substrate 1 are removed in this way, so that only the interior of the through hole 3 is filled with the conductive balls 4. This substrate 1 is heated so that the conductive balls 4 that fill the through hole 3 are melted. Thereafter, as shown in FIG. 2E, the melted conductive balls 4 are solidified to form a conducting through-silicon via 5.

The heating temperature for the substrate 1 can be selected as appropriate depending on the melting point of the conductive balls 4 used. However, it is preferable that the heating temperature be lower enough than a temperature, for example, 400° C., that affects aluminum wires that are generally used when the substrate 1 is a semiconductor substrate. Accordingly, it is preferable that the conductive balls 4 be made of low-melting metal or a low-melting alloy that can be melted at 200° C. or lower. If the conductive balls 4 are made of, for example, eutectic solder (composition ratio: tin/lead=62/38), a heating temperature of about 200° C. is enough because the eutectic solder can be melted at 200° C. or lower. The material of the conductive balls 4 may be a low-melting alloy containing at least two of lead, tin, zinc, cadmium, bismuth, palladium, and indium.

Figure 3A:
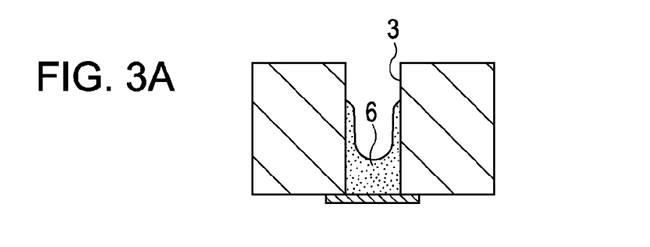
FIG. 3A is a cross-sectional view of the wiring board of the first embodiment, showing a method for forming a through-silicon via.
Figure 3B:
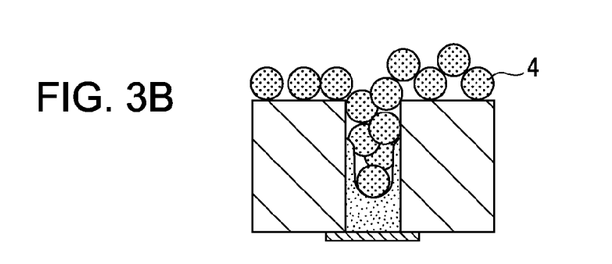
FIG. 3B is a cross-sectional view of the wiring board of the first embodiment, showing a method for forming a through-silicon.
Figure 3C:
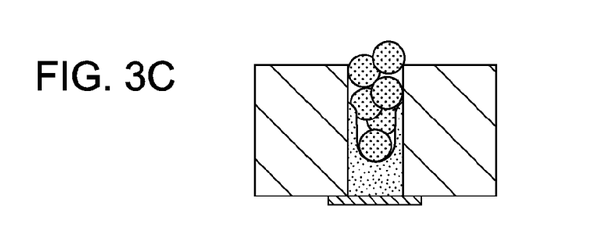
FIG. 3C is a cross-sectional view of the wiring board of the first embodiment, showing the method for forming the through-silicon via.
Figure 3D:
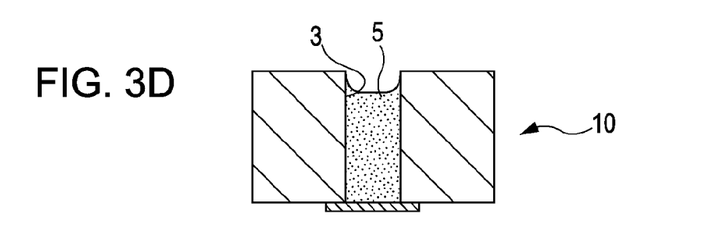
FIG. 3D is a cross-sectional view of the wiring board of the first embodiment, showing the method for forming the through-silicon via.

If the diameter of the conductive balls 4 is relatively large as compared with the opening diameter of the through hole 3, as described above, the filling factor of the conductive balls 4 is low. With the low filling factor, a conductor 6 formed by melting and solidifying the conductive balls 4 cannot sufficiently fill the through hole 3 and so may not serve as the through-silicon via (see FIG. 3A). In such a case, by repeating the above-described processes, as shown in FIGS. 3B to 3D, the through-silicon via 5 in which the through hole 3 is filled with a sufficient amount of solidified conductive balls 4 can be formed. By repeating a series of processes, as described above, a through-silicon via that sufficiently fills the through hole can be provided, and a wiring board can be manufactured at high productivity.

The method for manufacturing the wiring board according to the first embodiment allows through-silicon vias to be formed by the relatively simple process with a small number of processes. This allows a wiring board having through-silicon vias to be manufactured at low mass production cost.

Second Embodiment

Figure 4:
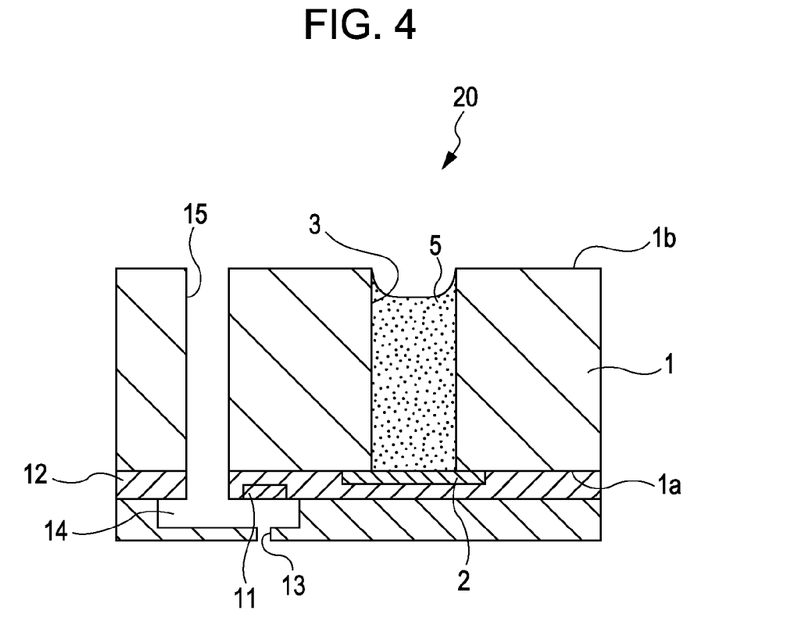
FIG. 4 is a schematic cross-sectional view of an inkjet printhead substrate according to a second embodiment.

Referring next to FIG. 4 and FIGS. 5A to 5D, a method for manufacturing an inkjet printhead substrate 20 according to a second embodiment of the present invention will be described. Here, as in the first embodiment, a method for forming a through-silicon via in the substrate will be described. FIG. 4 is a schematic cross-sectional view of the inkjet printhead substrate 20 according to the second embodiment; and FIGS. 5A to 5D are cross-sectional views of the inkjet printhead substrate 20, showing a method for forming a through-silicon via. Of the components of the inkjet printhead substrate 20 of the second embodiment, substantially the same components as those of the wiring board of the first embodiment are given the same reference numerals and their detailed descriptions will be omitted.

First, the configuration of the inkjet printhead substrate 20 will be described with reference to FIG. 4. The inkjet printhead substrate 20 includes the substrate 1, the wire 2 formed at the first surface 1a side of the substrate 1, and the through hole 3 that passes through the first surface 1a of the substrate 1 and the second surface 1b opposite the first surface 1a, in which an opening at the first surface 1a side is closed by the wire 2. A pressure generating element 11 that is electrically connected to the wire 2 and that generates pressure for ejecting ink is provided at the first surface 1a side of the substrate 1. The pressure generating element 11, a driving unit therefor (not shown), and the wire 2 are covered with a protective layer 12 formed on the first surface 1a of the substrate 1. The protective layer 12 needs to have the function of separating ink from the substrate 1 and can be made of silicon oxide or silicon nitride. An ink ejection port 13 for ejecting ink is provided at a position facing the pressure generating element 11. The inkjet printhead substrate 20 further includes an ink supply port 15 that passes through the first surface 1a and the second surface 1b of the substrate 1 to supply ink to the ink ejection port 13 through an ink channel 14 provided at the first surface 1a side of the substrate 1. The through-silicon via 5 is formed in the through hole 3 so as to fill the through hole 3, for electrically connecting the wire 2 at the first surface 1a side to the second surface 1b side of the substrate 1.

Referring next to FIGS. 5A to 5D, a method for forming the through-silicon via 5 by the method for forming the inkjet printhead substrate 20 according to the second embodiment will be described.

Figure 5A:
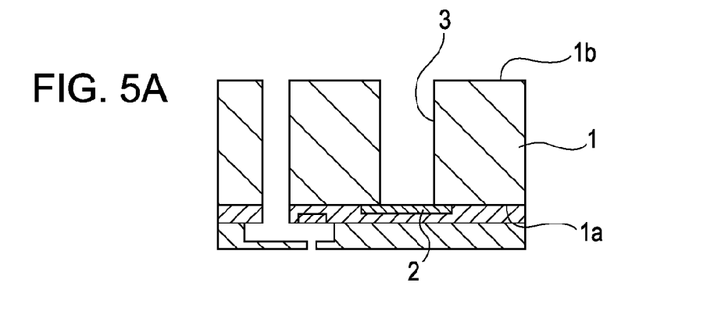
FIG. 5A is a cross-sectional view of the inkjet printhead substrate of the second embodiment, showing a method for forming a through-silicon via.

First, as shown in FIG. 5A, the substrate 1 is set, with the first surface 1a having the wire 2 down and the second surface 1b having the through hole 3 up.

Figure 5B:
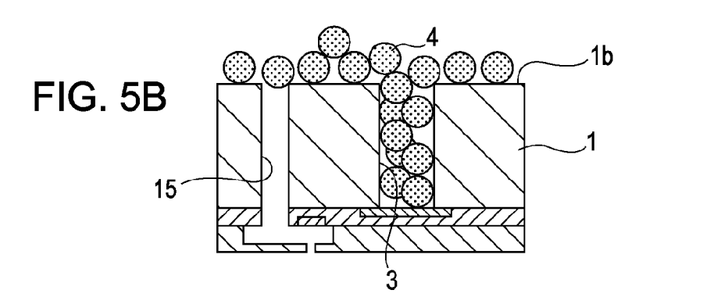
FIG. 5B is a cross-sectional view of the inkjet printhead substrate of the second embodiment, showing the method for forming the through-silicon via.
Figure 5C:
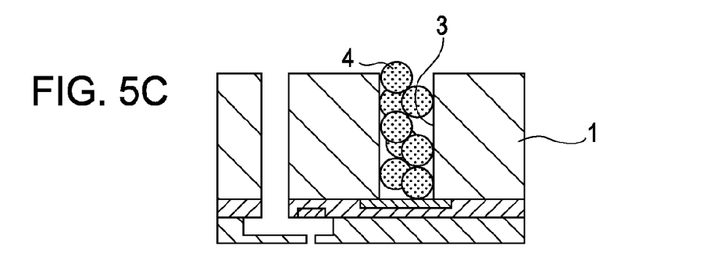
FIG. 5C is a cross-sectional view of the inkjet printhead substrate of the second embodiment, showing the method for forming the through-silicon via.

Next, as shown in FIG. 5B, a sufficient quantity of conductive balls 4 that is a powder conductive material is deposited on the substrate 1 to fill the through hole 3 with the conductive balls 4. The diameters of the conductive balls are smaller than the opening diameter of the through hole 3 in the second surface 1b, as in the first embodiment, but are larger than the opening diameter of the ink supply port 15 in the second surface 1b. Thus, in the process of filling the through hole 3 with the conductive balls 4, the conductive balls 4 are charged into the through hole 3 but not into the ink supply port 15. This eliminates the need for a masking work and an alignment work, thus leading to a decrease in the number of processes.

Figure 5D:
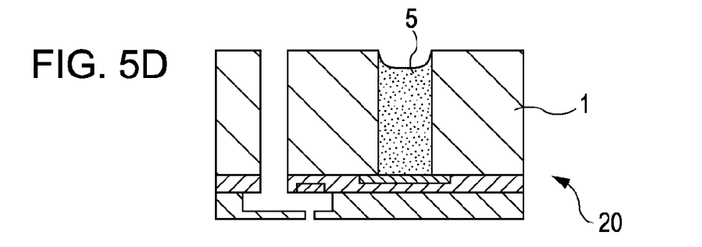
FIG. 5D is a cross-sectional view of the inkjet printhead substrate of the second embodiment, showing the method for forming the through-silicon via.

Next, the excess conductive balls 4 deposited on the second surface 1b of the substrate 1 without being charged into the through hole 3 are removed (see FIG. 5C), and thereafter, the conductive balls 4 that fill the through hole 3 are melted by heating the substrate 1. Thereafter, as shown in FIG. 5D, the melted conductive balls 4 are solidified to form the conducting through-silicon via 5. The details of the method for removing the conductive balls 4 and the method for heating the substrate 1 are the same as those of the first embodiment.

Even if the through hole 3 is not sufficiently filled with the conductor, the sufficient through-silicon via 5 can be formed as in the first embodiment by repeating the above-described processes, thus allowing the inkjet printhead substrate to be manufactured with high productivity.

The method for manufacturing an inkjet printhead substrate of the second embodiment allows an inkjet printhead substrate to be manufactured at low mass production cost by forming through-silicon vias to be formed at desired positions with a small number of processes.

The present invention can be applied to a semiconductor substrate for use as a wiring layer when wiring electronic devices and optical devices or connecting the devices in layers. The present invention can also be applied to an inkjet printhead mounted on an inkjet recording apparatus that records images by ejecting predetermined-color micro ink droplets onto desired positions.

Example

A concrete example of the present invention will be described below. Referring to FIGS. 6A to 6E, an example in which an inkjet printhead is manufactured by the method for manufacturing an inkjet printhead substrate according to the second embodiment will be described. FIGS. 6A to 6E are cross-sectional views showing the process of manufacturing the inkjet printhead. In this example, the components with the same reference numerals as those of the second embodiment are the same components as those of the second embodiment.

Figure 6A:
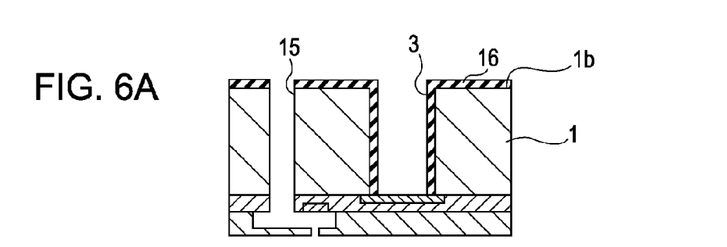
FIG. 6A is a cross-sectional view showing the process of manufacturing an inkjet printhead to which the method for manufacturing an inkjet printhead substrate of the second embodiment is applied.

In this example, as shown in FIG. 6A, the same substrate (wafer) 1 as in the second embodiment was prepared except that an insulating layer 16 is formed on the second surface 1b of the substrate 1 and on the inner wall of the through hole 3. The diameter of the through hole 3 was set at 90 μm, and the width of the ink supply port 15 was set at 50%.

Figure 6B:
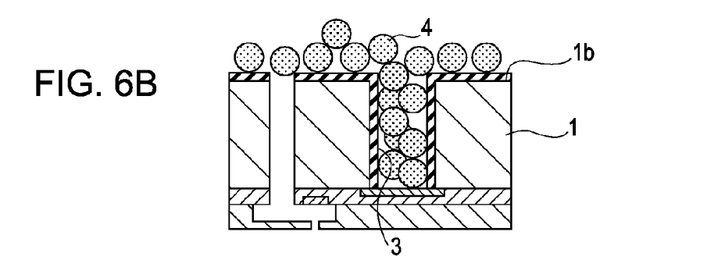
FIG. 6B is a cross-sectional view showing the process of manufacturing the inkjet printhead to which the method for manufacturing an inkjet printhead substrate of the second embodiment is applied.

Next, as shown in FIG. 6B, the conductive balls 4 formed of eutectic solder and having a substantially uniform diameter of about 70 μm were deposited on the second surface 1b of the substrate 1. The through hole 3 was sufficiently filled with the conductive balls 4 by giving ultrasonic vibrations to the substrate 1.

Figure 6C:
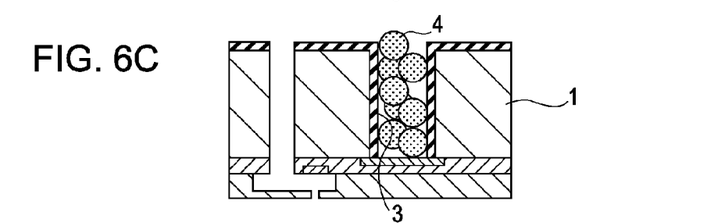
FIG. 6C is a cross-sectional view showing the process of manufacturing the inkjet printhead to which the method for manufacturing an inkjet printhead substrate of the second embodiment is applied.

Next, the conductive balls 4 excessively deposited on the substrate 1 were blown away by blowing nitride gas at an angle of 5° with respect to the substrate 1 (see FIG. 6C).

Figure 6D:
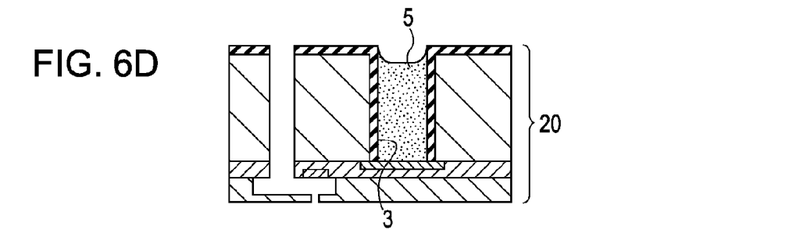
FIG. 6D is a cross-sectional view showing the process of manufacturing the inkjet printhead to which the method for manufacturing an inkjet printhead substrate of the second embodiment is applied.

Next, the inkjet printhead substrate 20 was placed in an oven set at a temperature of 200° C. for ten minutes and was thereafter subjected to air cooling to form the conducting through-silicon via 5 in the through hole 3 (see FIG. 6D).

Lastly, the wafer 1 was separated into chips with a dicer. The separated chips were mounted on a chip plate 19 having an electric wire 17 and a bump 18 and were sealed with a sealant to complete an inkjet printhead 30 shown in FIG. 6E.

Figure 6E:
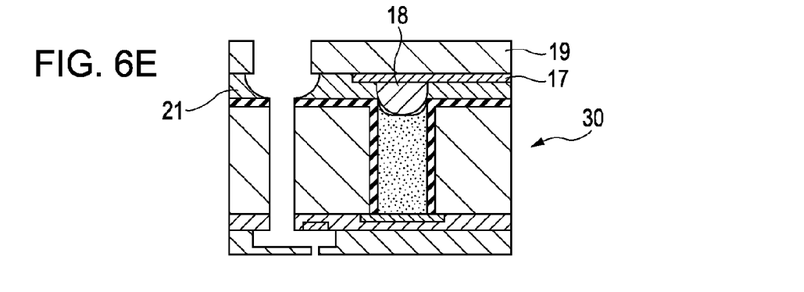
FIG. 6E is a cross-sectional view showing the process of manufacturing the inkjet printhead to which the method for manufacturing an inkjet printhead substrate of the second embodiment is applied.

The dimensional relationship of this example can prevent the conductive balls 4 from entering the ink supply port 15 and facilitates filling the through hole 3 with the conductive balls, thus allowing the inkjet printhead 30 to be easily manufactured.

While the present invention has been described with reference to exemplary embodiments, it is to be understood that the invention is not limited to the disclosed exemplary embodiments. The scope of the following claims is to be accorded the broadest interpretation to encompass all modifications and equivalent structures and functions.

This application claims the benefit of Japanese Patent Application No. 2008-323979 filed on Dec. 19, 2008, which is hereby incorporated by reference herein in its entirety.

What is claimed is:

1. A method for manufacturing an inkjet printhead substrate, comprising:

preparing a substrate having a hole passing through a first surface and a second surface opposite the first surface and an ink supply port passing through the first surface and the second surface and supplying ink to an energy-generating element formed on the first surface of the substrate, wherein an opening of the hole in the first surface is covered by a wiring member;

supplying a powder conductive material in the hole; and melting the powder conductive material that fills the hole by heating.

2. The method for manufacturing the inkjet printhead substrate according to claim 1, wherein the particle diameter of the powder conductive material is larger than the diameter of the ink supply port in the second surface and is smaller than the diameter of the hole in the second surface.

3. The method for manufacturing the wiring board according to claim 1, wherein the conductive material is an alloy containing at least two of lead, tin, zinc, cadmium, bismuth, palladium, and indium.

4. The method for manufacturing the wiring board according to claim 1, wherein the conductive material melts at 200° C. or lower.

* * * * *